(12) United States Patent
Yamada et al.

(10) Patent No.: US 6,538,301 B1
(45) Date of Patent: Mar. 25, 2003

(54) SEMICONDUCTOR DEVICE AND METHOD WITH IMPROVED FLAT SURFACE

(75) Inventors: Naoto Yamada, Tokyo (JP); Naoyuki Yoshida, Tokyo (JP); Atsushi Kimura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/141,300

(22) Filed: Aug. 27, 1998

(30) Foreign Application Priority Data

Aug. 29, 1997 (JP) .............................................. 9-234385

(51) Int. Cl.$^7$ ....................... H01L 23/544; H01L 29/06; H01L 23/58; H01L 23/48
(52) U.S. Cl. ....................... 257/620; 257/623; 257/635; 257/758; 257/E29.162
(58) Field of Search ................................. 257/647, 623, 257/644, 620, 759, 760, 618, 634, 420, 619, 641, 635, 758, 773, 774, 776, E29.111, E29.159, E29.161, E29.162; 438/740, 703, 622, 625

(56) References Cited

U.S. PATENT DOCUMENTS

| 5,399,530 A | * | 3/1995 | Kenmotsu | 438/625 |
| 5,593,925 A | * | 1/1997 | Yamaha | 438/703 |
| 5,786,638 A | * | 7/1998 | Yamaha | 257/760 |
| 5,793,114 A | * | 8/1998 | Nguyen et al. | 257/774 |
| 5,891,808 A | * | 4/1999 | Chang et al. | 438/740 |

FOREIGN PATENT DOCUMENTS

EP      0 874 398 A      10/1998
JP      8-306771         11/1996
JP      9-298196         11/1997

OTHER PUBLICATIONS

Patent Abstracts of Japan, vol. 1995, No.4, May 31, 1995, JP 07 014806 A (NEC Yamaguchi LTD), Jan. 17, 1995.
Patent Abstracts of Japan, vol. 016, No. 084 (E–1172), Feb. 28, 1992, JP 03 270007 A (Fujitsu Ltd; Others: 01), Dec. 2, 1991.
Patent Abstracts of Japan, vol. 015, No. 315 (E–1099), Aug. 12, 1991, JP 03 116946 A (Fujitsu LTD), May 17, 1991.
Patent Abstracts of Japan, vol. 009, No. 136 (E–320), Jun. 12, 1985, JP 60 018934 A (Hitachi Maikuro Computer Engineering KK; Others: 01 Jan. 31 1985.
Patent Abstracts of Japan, vol. 018, No.661 (E–1644), Dec. 14, 1994, JP 06 260554 A (Seiko Epson Corp), Sep. 16, 1994.
Patent Abstracts of Japan, vol. 017, No. 334 (E–1387), Jun. 24, 1993, JP 05 041450 A (Sony Corp), Feb. 19, 1993.

* cited by examiner

*Primary Examiner*—Olik Chaudhuri
*Assistant Examiner*—Brook Kebede
(74) *Attorney, Agent, or Firm*—Sughrue Mion, PLLC (57) ABSTRACT

A semiconductor substrate has an element formation region and a scribe line region surrounding the element formation region. A metal wiring layer is formed so as to cover end portions of a plurality of interlayer insulating films over the entire periphery of the element formation region and includes cut portions at the corner of the element formation region. Then, a SOG film is formed on the entire surface of the substrate by spin coating, at that time, material of the SOG film flows out through the cut portion toward the scribe line region to prevent a SOG puddle from forming at the corner of the element formation region.

13 Claims, 9 Drawing Sheets

SEMICONDUCTOR DEVICE AND METHOD WITH IMPROVED FLAT SURFACE

BACKGROUND OF THE INVENTION

1. Field of the Invention

The present invention relates to a structure and a manufacturing method of a semiconductor device such as a dynamic RAM.

2. The Related Art

Nowadays, in order to make a flat surface regarding a semiconductor device, a SOG (SPIN on GLASS) film is used. The SOG film is formed by introducing SOG material on the surface of the semiconductor wafer which is spinning, and flowing the SOG material from the central to the peripheral of the semiconductor wafer. Further, due to the integration, multi-layer interlayer insulating film structure is used. In such a structure, a metal wiring layer is used for preventing the edge of the multi-layer insulating films from peeling off each other. Such a device using the SOG film and the metal wiring layer is explained as follows, with reference to FIGS. 4A to 4H.

Figure 4A:
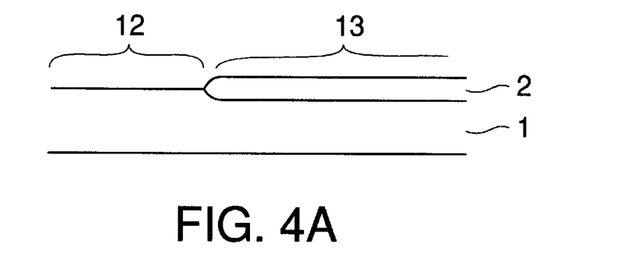
FIGS. 4A to 4H show the respective sectional views showing the manufacturing steps of a semiconductor device according to a related art.

FIGS. 4A to 4H are sectional views for explaining a manufacturing process of a semiconductor device of the related art. As shown in FIG. 4A, a field oxidation film 2 is formed in a chip region 13 to create an element formation region on a surface of a substrate 1, for example, by selective oxidation (LOCOS: Local Oxidation of Silicon). A scribe line region 12 is a cutting region necessary for dicing a semiconductor wafer into separate chips.

Figure 4B:
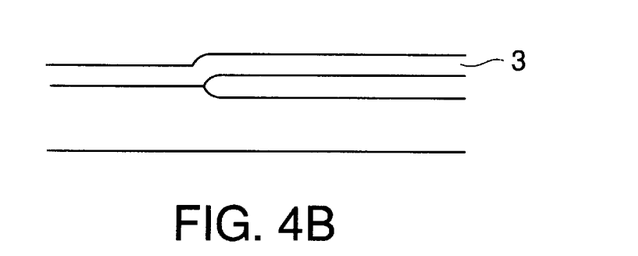
Figure 4C:
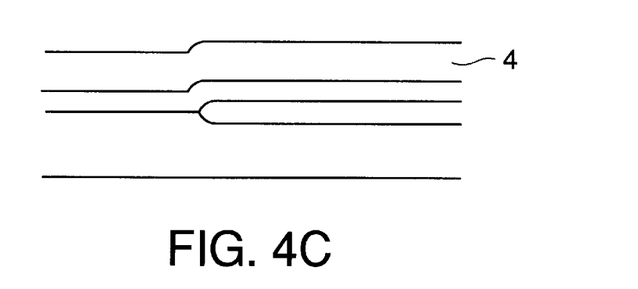
Figure 4D:
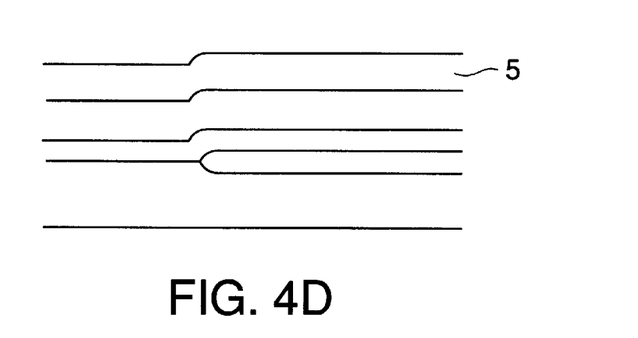
Figure 4E:
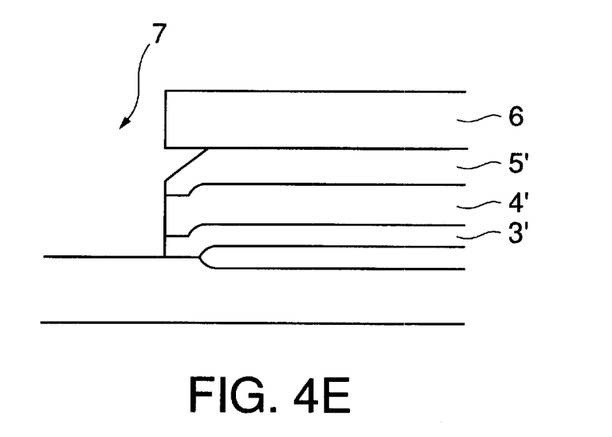

After the field oxidation film 2 has been formed, subsequently, as shown in FIGS. 4B to 4D, interlayer insulating films, 3 to 5, are sequentially formed by, for example, a CVD method so as to cover the entire of the substrate 1 on which the field oxidation film 2 has been formed. Although omitted here, wiring layers and element films are formed between the respective interlayer insulating films. Thereafter, as shown in FIG. 4E, a resist is applied to the entire surface, and is exposed and developed to form a resist pattern 6. Then the respective interlayer insulating films, 3 to 5, are etched by using the resist pattern 6 as a mask to form an opening portion 7 and patterned interlayer insulating films, 3' to 5'.

Figure 4F:
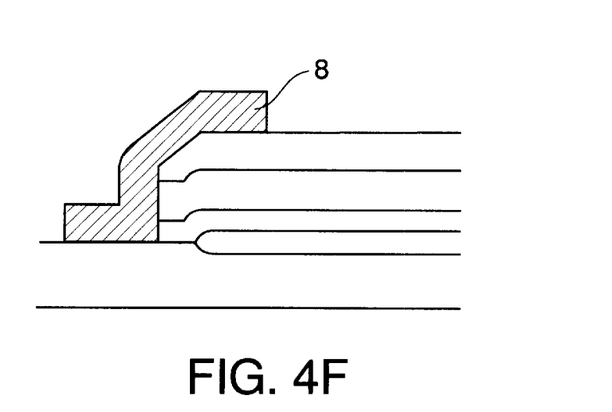
Figure 4G:
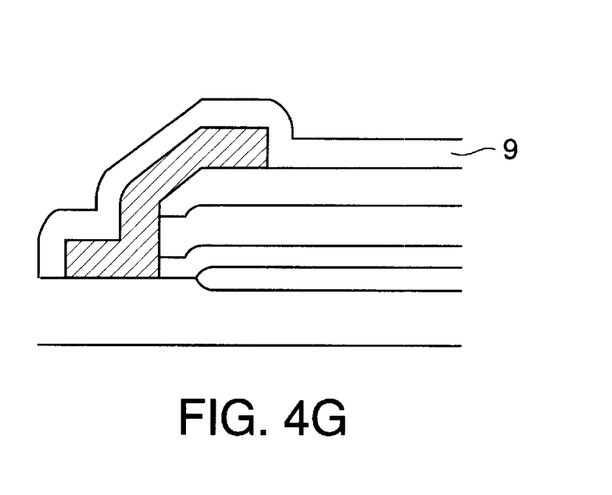

After the opening portion 7 has been formed and the resist pattern 6 has been removed, subsequently, as shown in FIG. 4F, metal material, for example, aluminum (Al) is deposited on the entire surface by, for example, a sputtering method, and it is selectively etched by RIE (reactive Ion Etching) to form a metal wiring layer 8. The metal wiring layer 8 is formed to prevent peeling of end portions of the respective interlayer insulating films 3' to 5'. Thereafter, as shown in FIG. 4G, an insulating film 9, for example, an oxide film is formed by, for example, a CVD method, so as to cover the entire surface.

Figure 4H:
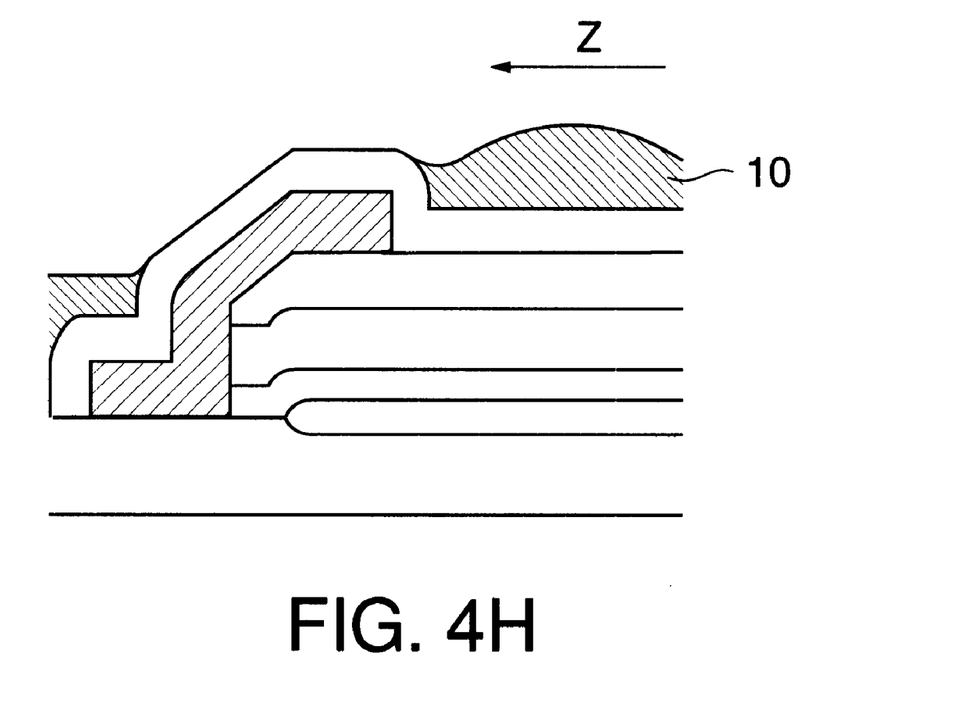

After the insulating film 9 is formed, subsequently, as shown in FIG. 4H, a SOG (SPIN on GLASS) film 10 is formed on the entire surface by a spin coating method. In the drawing, an arrow Z denotes a flow of, for example, silicon dioxide at the time when the SOG film is formed by applying silicon dioxide (such a flow of silicon dioxide will be hereinafter referred to as flow of SOG). Thereafter, by using the selective ratio of the SOG film and the oxide film, surface flattening is carried out by a dry etch-back treatment.

Figure 5A:
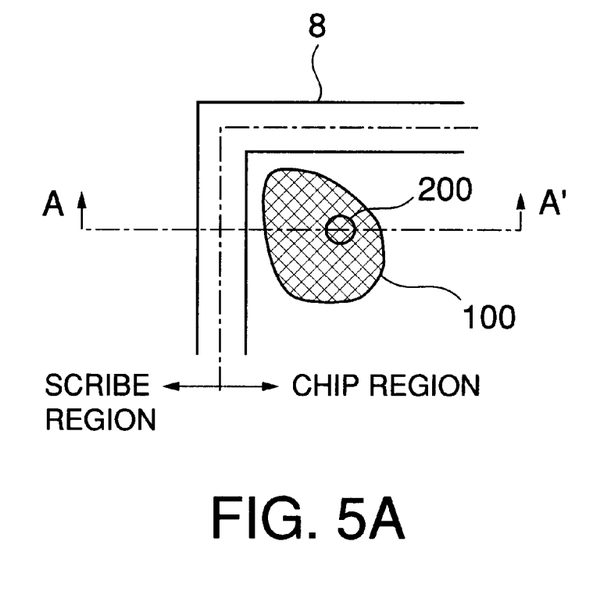
FIGS. 5A and 5B shows a view for explaining problems of the semiconductor device of the related art, FIG. 5A being a top view of the vicinity of a corner portion of the semiconductor device of the related art, and FIG. 5B being a sectional view taken along I—I of FIG. 5A.
Figure 5B:
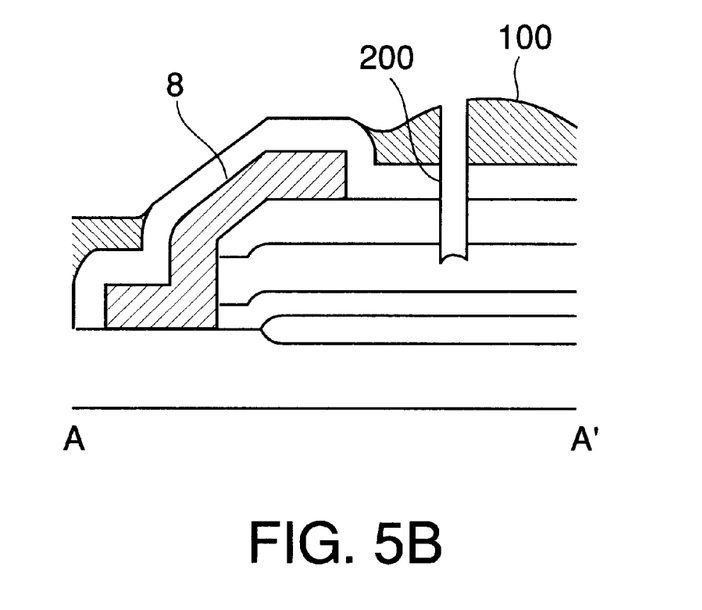

In recent years, to increase the degree of integration, in a semiconductor device such as a dynamic RAM, a device element has been disposed on a peripheral portion of a chip region which historically has not been used as a device region. For example, as illustrated in FIGS. 5A and 5B, a through hole 200 is attempted to be formed in the interlayer insulating films 3 to 5 on the peripheral portion. As a result, in the manufacturing method described above, the following problems have began to occur.

In the manufacturing method, after the metal wiring layer 8 is formed so as to cover the end portions of the interlayer insulating films over the entire circumference of the chip region, the SOG film 10 is formed by applying a spin coating. In this case, since the surrounding portion where the metal wiring layer has been formed is higher, the flow of SOG is blocked by the stepped portion. Thus, as shown in FIGS. 5A and 5B, a thick SOG is accumulated in the vicinity of a corner portion of the metal wiring layer (which means that, for example, when silicon dioxide is applied to form a SOG film, thick silicon dioxide is accumulated), so that a SOG puddle 100 is formed. If the SOG puddle 100 forms, since the SOG puddle 100 is not completely etched back and remains when the surface is flattened, flattening damaged may occur. Moreover, when the SOG puddle 100 can not be completely etched back and some bump remains, for the through hole forming a contact hole 200, for making contact with a wiring layer just below that portion, can not be opened completely and the contact can not be properly made to the wiring layer.

SUMMARY OF THE INVENTION

It is an object of the present invention to provide a semiconductor device and a method of manufacturing the semiconductor device which can prevent SOG from thickly accumulating in the vicinity of a corner portion of a metal wiring layer used to prevent the edge of multi-layer interlayer insulating films on the chip edge from peeling off.

A semiconductor device of the present invention comprises: a semiconductor substrate; an interlayer insulating film formed over the semiconductor substrate; and a metal wiring layer formed so as to cover an end portion of the interlayer insulating film over the periphery of an element formation region of the semiconductor substrate, the metal wiring layer having at least one cut portion formed at the vicinity of a corner of the element formation region.

A semiconductor device of the present invention comprises: a semiconductor substrate having at least a recess located in the vicinity of a corner of an element formation region; a first interlayer insulating film formed over the element formation region of the semiconductor substrate; a second interlayer insulating film formed to cover from the first interlayer insulating film over the element formation region to the semiconductor substrate exposed by the recess; and a metal wiring layer covering an end portion of the second interlayer insulating film, the metal wiring layer having an end portion formed on the interlayer insulating film in the recess.

A method of manufacturing a semiconductor device of the present invention, comprises the steps of:

forming at least one interlayer insulating film over a semiconductor substrate, the interlayer insulating film having an end portion in the vicinity of an element formation region of the semiconductor substrate;

forming a metal wiring layer so as to cover the end portion of the interlayer insulating film, the metal wiring layer having at least one cut portion in the vicinity of a corner of the element formation region; and forming, by spin coating, an insulating film on the surface of the semiconductor substrate so that material of the insulating film flows out through the cut portion.

A method of manufacturing a semiconductor device of the present invention, comprises the steps of:

forming a field insulating film in an element formation region of a surface of a semiconductor substrate;

forming a first interlayer insulating film on the field insulating film;

removing the field insulating film and the first interlayer insulating film in vicinity of a boundary of a scribe line region and the element formation region to form a cavity in vicinity of the boundary of the scribe line region and the element formation region;

forming a second interlayer insulating film to cover from on the element formation region to on a surface of the semiconductor substrate exposed by the cavity;

forming a metal wiring layer so as to cover an end portion of the interlayer insulating film, the metal wiring layer having an end portion which is on the second interlayer insulating film formed over a surface of the semiconductor substrate exposed by the cavity; and forming an insulating film over the second interlayer insulating film and the metal wiring layer.

In the present invention comprising a cut portion at the corner portion of the metal wiring layer, when, for example, a SOG film is spin coated as the insulating film, the SOG flows out through the cut portion to the scribe line region. Thus, the SOG does not excessively accumulate in the vicinity of the corner portion of the metal wiring layer.

In the present invention in which a recess portion is formed at the corner periphery of the semiconductor element formation region and the metal wiring layer has an end portion formed on the interlayer insulating film in the recess portion, since the stepped portion of the metal wiring layer is lessened by the recess portion, for example, when the SOG film is formed by spin coating, it becomes possible for the SOG to flow out to the scribe line region. Thus, it is possible to eliminate the SOG from being blocked by a stepped portion of the metal wiring layer.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

Figure 1A:
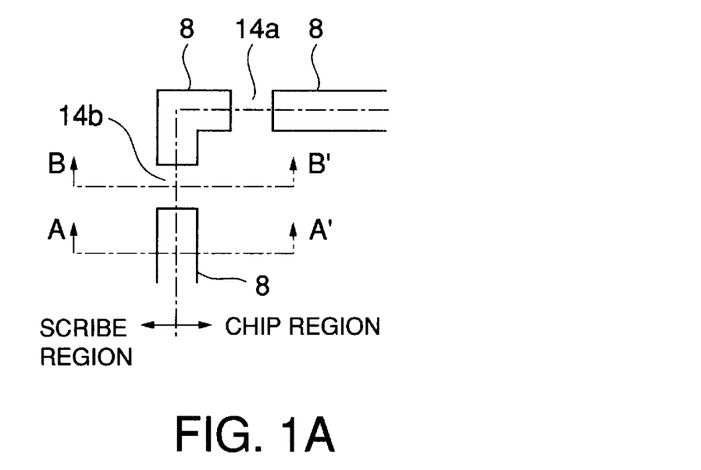
FIGS. 1A–1C show diagrams showing a semiconductor device according to a first embodiment of the present invention, FIG. 1A being a top view of the vicinity of a corner portion of the semiconductor device, FIG. 1B being a sectional view taken along I—I of FIG. 1A, and FIG. 1C being a sectional view taken along II–II' of FIG. 1A.
Figure 1B:
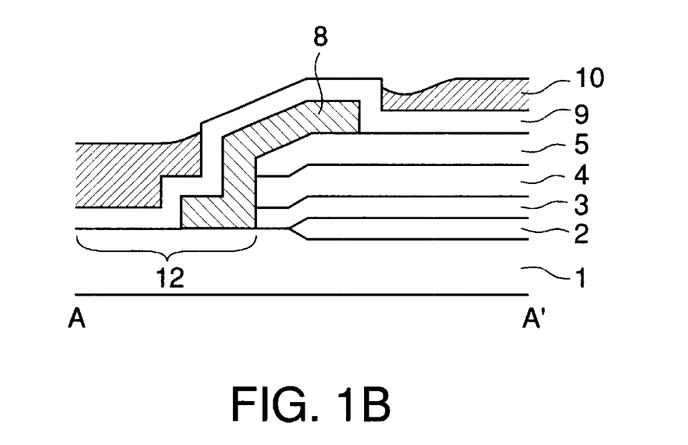
Figure 1C:
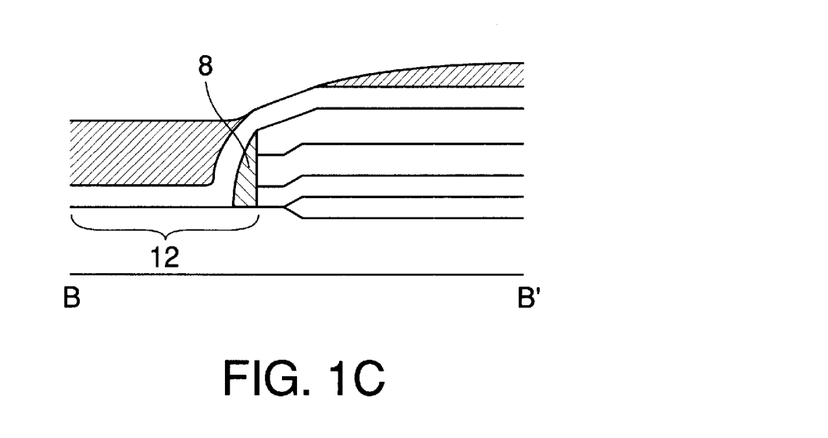

FIGS. 1A to 1C illustrate a semiconductor device of a first embodiment of the present invention. Although the basic manufacturing process of this semiconductor device is the same as the manufacturing process shown in FIGS. 4A to 4I, when a metal wiring layer 8 is formed for preventing the end portion of interlayer insulating films 3 to 5 from peeling off, cut portions 14a and 14b are formed in the vicinity of a corner portion of the metal wiring layer 8 as shown in FIG. 1A. The cut portions 14a and 14b are formed in such a manner that metal material, for example, aluminum (Al) is deposited on the entire surface by, for example, a sputtering method, and when it is selectively etched by RIE to form the metal wiring layer 8, places which become the cut portions 14a and 14b are also etched at the same time.

As mentioned above, after the cut portions 14a and 14b are formed in the vicinity of the corner portion of the metal wiring layer 8, SOG is applied by spin coating. At the time of the spin coating, the SOG flows out to the scribe line region 12 through the cut portions 14a and 14b. The cut portions 14a and 14b have size enough to flow out material of the SOG film through the cut portions 14a and 14b to flatten the SOG film 10 efficiently. The cut portions 14a and 14b make it possible to eliminate excessive accumulation of SOG in the vicinity of the corner portion of the metal wiring layer 8. As a result, in the places of the cut portions 14a and 14b, a flat SOG film 10 is formed as shown in FIGS. 1B and 1C. Regarding this embodiment, since the flat SOG film can be formed, there is no problem properly forming an opened contact hole (through hole) in the vicinity of the corner portion of the metal wiring layer 8.

In the above-mentioned manufacturing process, although two cut portions are formed for one corner of the metal wiring layer 8 the number of cut portions is not limited, so long as it is possible to flow the SOG out to the side of the scribe line region so that the SOG does not thickly accumulate. For example, the number of the cut portions may be one. On the other hand, it could be merely a drain hole in the metal by layer.

Figure 2:
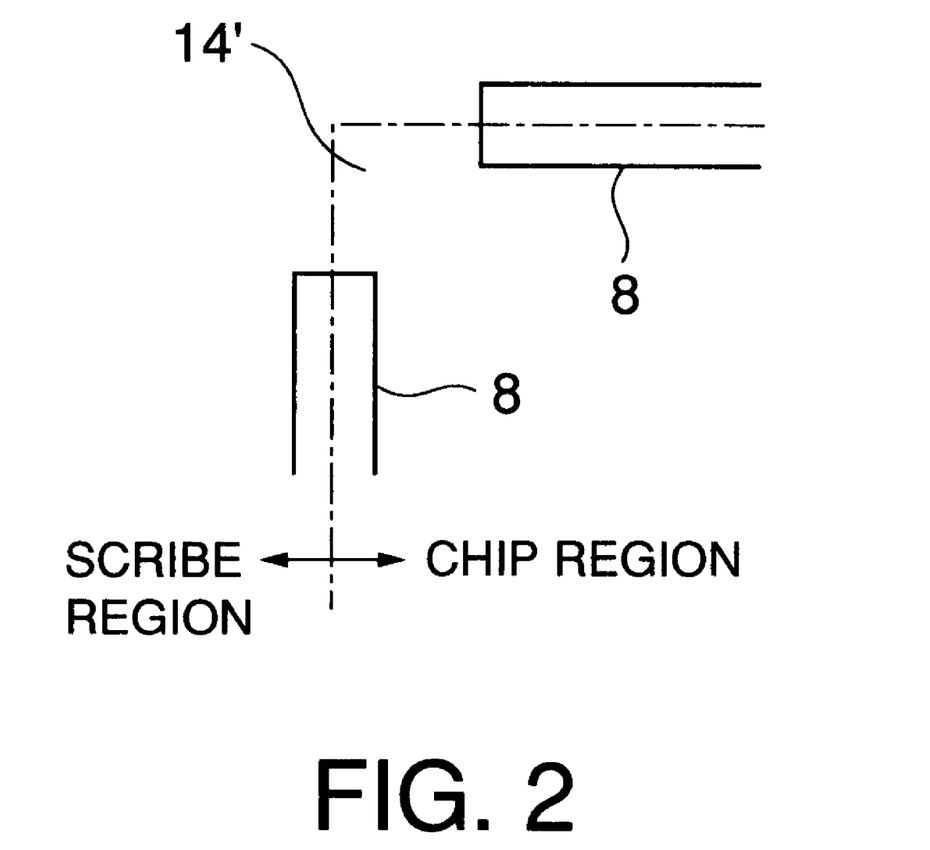
FIG. 2 shows a top view of the vicinity of a corner portion of a semiconductor device according to a second embodiment of the present invention.

FIG. 2 shows a second embodiment of a semiconductor device of the present invention. In this embodiment, a cut portion is directly provided at the corner of the metal wiring layer 8. The SOG can therefore be effectively flown out to the scribe line region so that the SOG film can be made more flat. Metal material, for example, aluminum (Al) is deposited on the entire surface by, for example, a sputtering method and it is then selectively etched by RIE to form the metal wiring layer 8. At that time, the corner of the metal wiring layer 8 is simultaneously etched to form a cut portion 14' for flowing the SOG out to the side of a scribe line region.

Figure 3A:
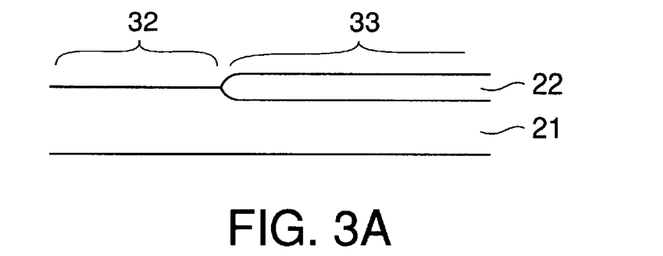
FIGS. 3A to 3I show the respective sectional views showing the manufacturing steps of a semiconductor device according to a third embodiment of the present invention.

FIGS. 3A to 3I show a third embodiment of a semiconductor device of the present invention. As shown in FIG. 3A, a field oxidation film 22 for element separation is formed by selective oxidation (LOCOS) in the chip region 33 of the surface of a substrate 21. A scribe line region 32 is a cutting region necessary for dicing the wafer into separate chips.

Figure 3B:
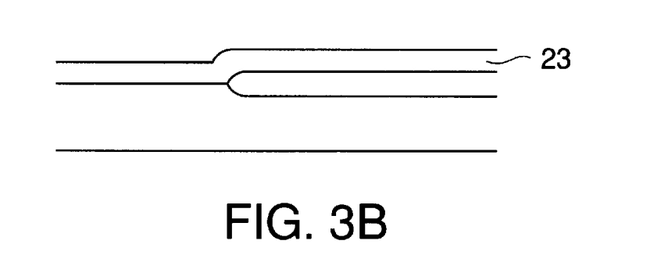
Figure 3C:
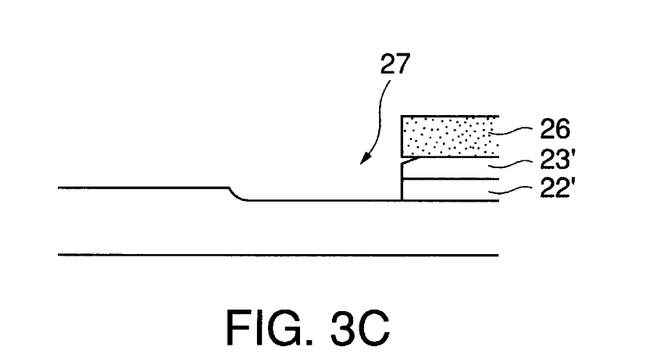

After the field oxidation film 22 is formed, subsequently, as shown in FIG. 3B, an interlayer insulating film 23 is formed so as to cover the entire surface of the substrate 21 by, for example, a CVD method. Subsequently, as shown in FIG. 3C, a resist is applied to the entire surface of the substrate, and is exposed and developed to form a resist pattern 26. By using the resist pattern 26 as a mask, the interlayer insulating film 23 and the field oxidation film 22 are etched to form an opening portion 27 recess (cavity) in the substrate and to form patterned interlayer insulating film 23' and patterned field oxidation film 22'.

Figure 3D:
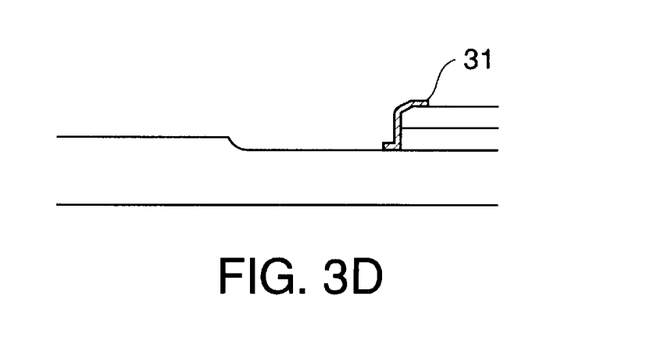
Figure 3E:
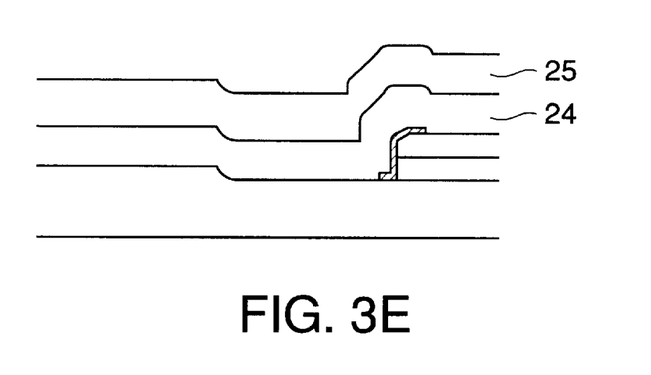

After the resist pattern 26 is removed, subsequently, as shown in FIG. 3D, a silicide layer, for example, including tungsten, is deposited by, for example, a sputtering method, and this layer is selectively etched by RIE to form a conductive layer 31 so as to cover the end portions of the patterned interlayer insulating film 23' and the patterned field oxidation film 22'. The conductive layer 31 performs the function of preventing peeling off of the end portions of films 22' and 23'. Thereafter, as shown in FIG. 3E, interlayer insulating films 24 and 25 are sequentially formed so as to cover the entire surface of the substrate by, for example, a CVD method. Although omitted here, a wiring layer and an element electrode are formed between the respective interlayer insulating films 23 to 25.

Figure 3F:
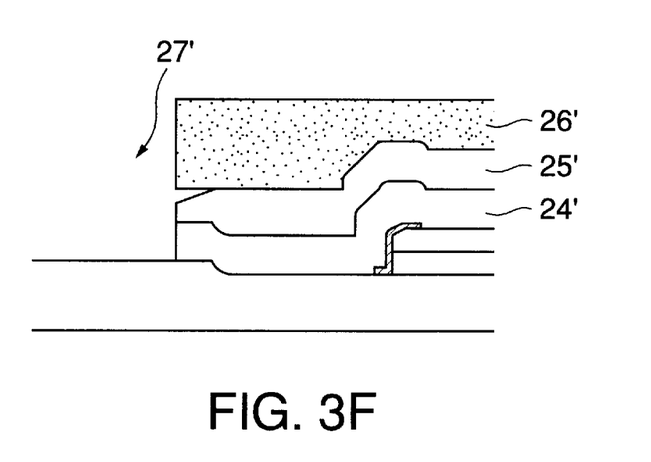

Subsequently, as shown in FIG. 3F, a resist is applied to the entire surface, and is exposed and developed to form a resist pattern 26'. By using the resist pattern 26' as a mask, the respective interlayer insulating films 24 and 25 are etched to form an opening portion 27' and to form patterned interlayer insulating films 24' and 25'.

Figure 3G:
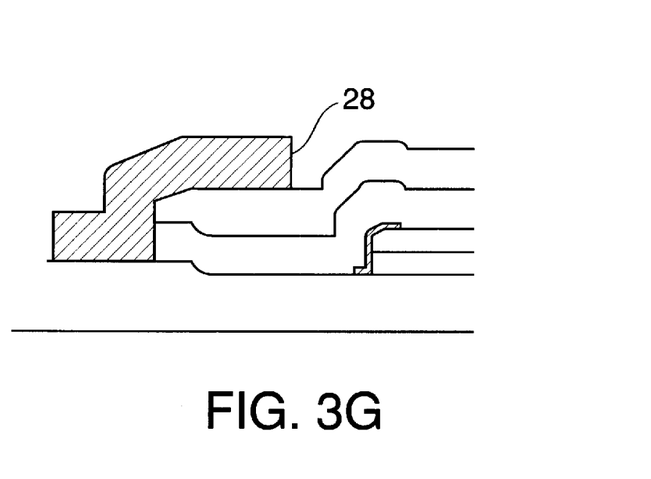
Figure 3H:
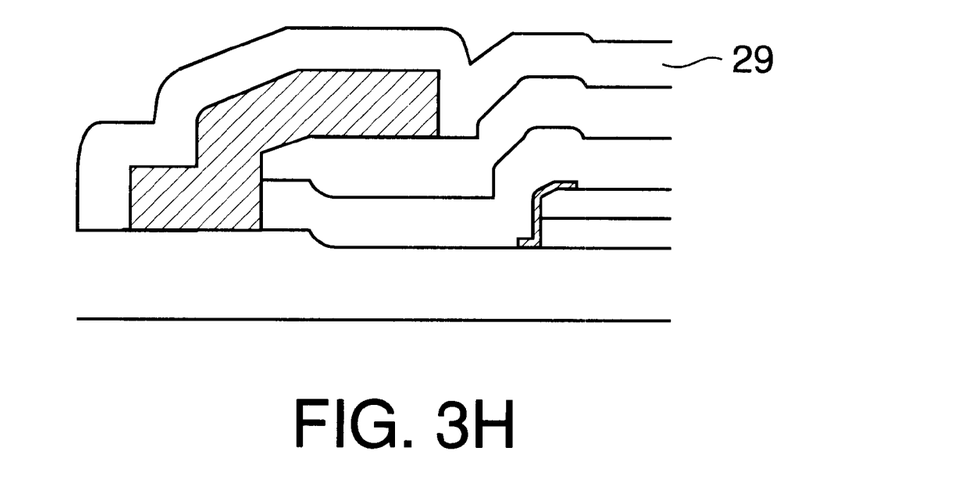

After the resist pattern 26' is removed, subsequently, as shown in FIG. 3G, metal material, for example, aluminum (Al) is deposited on the entire surface by, for example, a sputtering method, and selectively etched by the RIE to form a metal wiring layer 28 for preventing peeling off the end portions of the respective patterned interlayer insulating films 24' and 25'. Thereafter, as shown in FIG. 3H, an insulating film 29 is formed so as to cover the entire surface of the substrate by, for example, a CVD method.

Figure 3I:
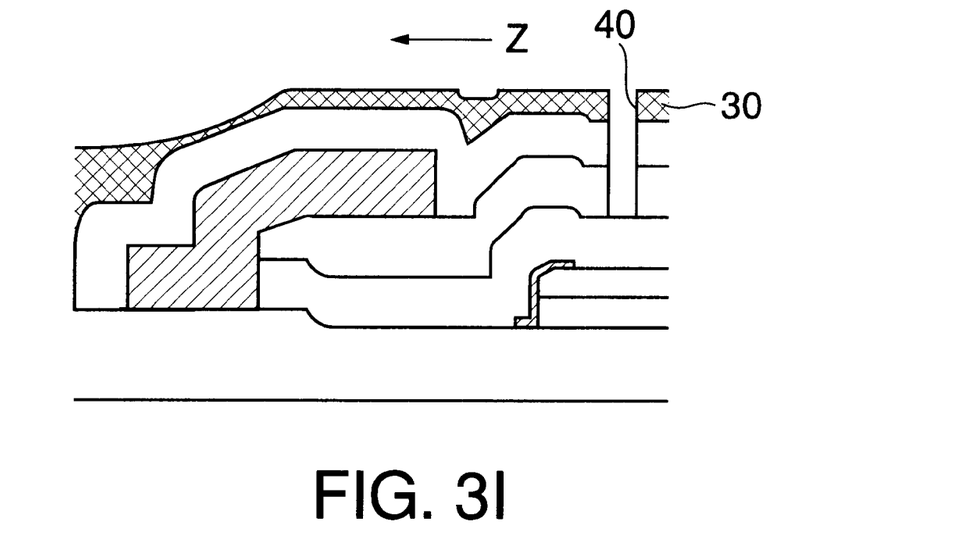

Subsequently, as shown in FIG. 3I, an SOG film 30 is formed on the entire surface by a spin coating method. In the drawing, an arrow Z indicates the flow of SOG by the spin coating. Thereafter, surface flattening is carried out by etch-back. Then, for example, at the corner of the chip region, a contact hole 40 is formed to expose the surface of a conductive film (not shown), which is located between the layers 24' and 25', and is used as an element electrode. At that time, a contact hole, located at a portion in the chip region except the corner of the chip region, for example, center portion of the chip region, can be formed to expose the surface of a conductive film, which is located between the layers 24' and 25', and is used as element electrode. That is, Both contact holes are formed by the same forming condition. It should be noted that, regarding the embodiments 1 and 2 of the present invention, such a contact hole as mentioned above can also be formed at the corner portion of the chip region such that a contact hole having substantially the same depth as the contact formed at center portion of the chip region is formed.

Regarding the third embodiment, since this embodiment has the structure that the recess portion is formed by etching the field oxidation film 22 until the substrate 21 is exposed and the end portions of the interlayer insulating films 24' and 25' are formed near to the place where the recess portion has been formed, a stepped portion of the metal wiring layer 28, formed at the end portions of the interlayer insulating films 24' and 25', becomes less as a result of the recess portion. That is, compared with the first and second embodiment, the edge potion of the metal wiring layer 28 is not formed on the interlayer insulating films 24' and 25' over the films 22' and 23' but on the interlayer insulating films 24' and 25' on the surface of the semiconductor substrate 21 exposed by the recess. Therefore, the difference between the top surface height of the edge of the metal wiring layer 28 and the top surface height of the interlayer insulating film 29 formed over the film 22 becomes small enough to flow SOG by the spin coating without preventing SOG from flowing by the edge of the metal wiring layer 28.

Moreover, in the third embodiment, among the plurality of interlayer insulating films 23' to 25', since the end portion of the interlayer insulating film 23' at the lowermost layer is covered with the conductive layer 31, the end portions of the interlayer insulating films 24' and 25' are covered with the metal wiring layer 28. The metal wiring layers 31 and 28 are formed so as not to overlap with each other. As compared with the case where the end portions of a plurality of interlayer insulating films are covered with one metal wiring layer, a stepped portion of the metal wiring layer becomes less because the stepped portion of the metal wiring layer 28 becomes less by the removed interlayer insulating film 23'.

Moreover, in the third embodiment, the film thickness of the conductive layer 31 can be made thin because the layer 31 only holds the layers 22' and 23'. The stepped portion thereof therefore becomes small. Thus, an SOG puddle due to the stepped portion of the conductive layer 31 does not occur.

In addition, in the case where a heat-resistant material such as a tungsten silicide film or a polycrystalline silicon film is used as a conductive layer 31, a flat interlayer insulating film can be formed by a BPSG film in place of the SOG. The BPSG film does not produce a puddle such as the SOG puddle. That is, the BPSG film is flatten by heat treatment. Such silicon film or polycrystalline silicon films which electrically connects between one of those films and a conductive film in the chip region do not cause short circuit even though the BPSG film is used. Although the metal wiring layer 28 is made by Al rather than a refractory metal, the tendency to form short circuit electrical connects between the metal wiring layer 28 and a conductive film used as a portion of a semiconductor element in the chip region is rare even though the BPSG film is used because the metal wiring layer 28 is far enough from the conductive film.

Further, although the conductive layer 31 is formed so as to cover the end portions of the interlayer insulating film 23 and the field oxidation film 22, the invention is not limited to this. For example, the conductive layer is arranged so as to cover only the end portion of the field oxidation film 22, or the end portions of a plurality of interlayer insulating films. According to another alternative design, it is also possible to use a structure having only a recess portion formed by etching the field oxidation film, wherein the conductive layer 31 is not provided.

In the third embodiment, the recess portion formed by etching the field oxidation film 22 until the substrate 21 is exposed, may be formed over the entire periphery of a portion on the surface of the substrate where the end of the interlayer insulating film is covered with the metal wiring layer, or may be formed at a part of the periphery. In any cases, the above described effect can be obtained. However, in the case where the recess portion is formed on a part of the periphery, like the cut formation position as described in the first and second embodiments, it is desirable to provide it at the corner portion of the metal wiring layer.

In the invention in which a cut portion is provided at the corner portion of a metal wiring layer, in the case where an SOG film is spin coated, since the SOG can be flown out through the cut portion to a scribe line region, it is possible to prevent the SOG from thickly and excessively accumulating in the vicinity of the corner portion of the metal wiring layer, so that there is obtained an effect that a semiconductor device having a flat surface can be provided. In addition, since the SOG puddle can be prevented, it is possible to avoid such a case that a contact hole can not be opened, so that the invention has an effect that a highly reliable semiconductor device can be provide.

Moreover, also in the embodiment in which a stepped portion of a metal wiring layer is lessened by providing a recess portion, similarly to the above-mentioned case, since it is possible to prevent the SOG from being blocked and accumulating, the invention results in a semiconductor device having a flat surface and high reliability can be provided.

It is apparent from the specification that the present invention is not limited to the above embodiments but may be modified and changed without departing from the scope and spirit of the invention. For example, it is possible to combine one of the first and second embodiments with the third embodiment.

What is claimed is:

1. A semiconductor device, comprising:
   a semiconductor substrate having at least a recess located in a corner of an element formation region;
   a first interlayer insulating film formed over said element formation region of said semiconductor substrate;
   a second interlayer insulating film formed to cover from said first interlayer insulating film to said semiconductor substrate exposed by said portion of said recess;
   a metal wiring layer covering an end portion of said second interlayer insulating film, said metal wiring layer having an end portion formed on the second interlayer insulating film in the recess; and
   a conductive layer which covers an end portion of said first interlayer insulating film and arranged not to overlap with said metal wiring layer.

2. The device as claimed in claim 1, wherein said conductive layer is a silicide film.

3. A semiconductor device comprising:
   a semiconductor substrate having a main surface, said main surface including a chip region and a scribe line region along said chip region;
   an interlayer insulating layer formed over said main surface of said semiconductor substrate, said interlayer insulating layer being terminated on said scribe line region to thereby form an edge portion thereof along said chip region, said edge portion having a side surface and said interlayer insulating layer having a top main surface that corresponds to said chip region of said semiconductor substrate and merges with said side surface; and
   a metal layer formed along said edge portion of said interlayer insulating layer to cover said edge portion, said metal layer thereby including a first portion formed on and along said side surface of said edge portion, a second portion extended from said first portion and terminated on a part of said scribe line region of said semiconductor substrate, and a third portion extended from said first portion and terminated on a part of said top main surface of said interlayer insulating layer, said third portion of said metal layer having at least one cut part that makes a groove in said third portion of said metal layer.

4. The device as claimed in claim 3, said device further comprising a spin on glass (SOG) film formed over said metal layer and said interlayer insulating film.

5. The device as claimed in claim 4, wherein said SOG film is formed by spin coating while material of said SOG film on said interlayer insulating layer flows out through said cut part.

6. The device as claimed in claim 3, wherein said metal layer has a corner, and said cut portion is arranged at said corner in said third portion.

7. The device as claimed in claim 3, wherein said metal layer has a corner, and said cut portion is arranged in said third portion excepting said corner.

8. The device as claimed in claim 7, wherein said edge portion is defined by a first edge running in a first direction of said interlayer insulating layer and a second edge running in a second direction perpendicular to said first direction of said interlayer insulating layer, thereby to provide a corner portion of said interlayer insulating layer by crossing said first edge with said second edge, said corner of said metal layer corresponds to said corner portion of said interlayer insulating layer, said cut part has a first cut part in said third portion on said first edge and a second cut part in said third portion on said second edge.

9. A semiconductor device comprising:
   a semiconductor substrate having a main surface, said main surface including a first region, a second region along said first region and a third region along said second region;
   a first interlayer insulating layer formed over said first region of said semiconductor substrate and terminated on said second region of said semiconductor substrate to thereby form an edge portion thereof along said first region;
   a first metal layer formed along said edge portion of said first interlayer insulating layer to cover said edge portion of said first interlayer insulating layer with termination on respective parts of said first interlayer insulating layer and said second region of said semiconductor substrate;
   a second interlayer insulating layer formed to cover said second region of said semiconductor substrate, said second interlayer insulating layer and said first metal layer terminated on said third region of said semiconductor substrate to thereby form an edge portion thereof along said second region; and
   a second metal layer formed along said edge portion of said second interlayer insulating layer to cover said edge portion of said second interlayer insulating layer with termination on respective parts of said second interlayer insulating layer and said third region of said semiconductor substrate.

10. The device as claimed in claim 9, said device further comprising a spin on glass (SOG) film formed over said metal layer and said second interlayer insulating film.

11. The device as claimed in claim 9, wherein said second metal layer is arranged so as not to overlap with said first metal layer.

12. The device as claimed in claim 9, wherein said second metal layer is arranged so as not to overlap with said first interlayer insulating layer.

13. The device as claimed in claim 9, wherein said main surface of said semiconductor substrate includes a recess formed on a portion of said first region and a portion of said second region, said recess is not formed on said third region, said first and second interlayer insulating layers directly contact with said main surface exposed by said recess.

* * * * *